US006946922B2

(12) United States Patent
Takemura et al.

(10) Patent No.: US 6,946,922 B2
(45) Date of Patent: Sep. 20, 2005

(54) CRYSTAL OSCILLATION DEVICE AND ELECTRONIC DEVICE USING THE SAME

(75) Inventors: Tadaji Takemura, Shiga-ken (JP); Yasushi Okumura, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 117 days.

(21) Appl. No.: 10/721,363

(22) Filed: Nov. 26, 2003

(65) Prior Publication Data

US 2004/0140858 A1 Jul. 22, 2004

(30) Foreign Application Priority Data

Jan. 17, 2003 (JP) ........................................ 2003-010229

(51) Int. Cl.[7] .............................. H03B 5/32; H05K 1/18
(52) U.S. Cl. ..................... 331/108 D; 331/68; 331/158; 331/187
(58) Field of Search .................. 331/68, 108 D, 331/116 R, 116 FE, 116 M, 158–159, 187; 361/760, 767–771

(56) References Cited

FOREIGN PATENT DOCUMENTS

| JP | 10002741 A | * | 1/1998 |
|---|---|---|---|
| JP | 2001-177345 | | 6/2001 |
| JP | 2002-064333 | | 2/2002 |
| JP | 2002-084138 | | 3/2002 |

* cited by examiner

*Primary Examiner*—David Mis
(74) *Attorney, Agent, or Firm*—Keating & Bennett, LLP

(57) ABSTRACT

A crystal oscillation device includes a crystal oscillator including a package with first connecting electrodes provided on a flat bottom surface mounted on a flat, thin circuit board. Circuit components and second connecting electrodes provided in one-to-one correspondence with the first connecting electrodes are mounted on one principal surface of the circuit board. The crystal oscillator is supported by top surfaces of a transistor and a varicap diode that are the highest among the circuit components mounted on the circuit board. The crystal oscillator and the circuit board are electrically connected with solder provided between the first and second connecting electrodes. The solder also attracts the crystal oscillator toward the circuit board.

20 Claims, 7 Drawing Sheets

CRYSTAL OSCILLATION DEVICE AND ELECTRONIC DEVICE USING THE SAME

BACKGROUND OF THE INVENTION

1. Field of the Invention

The present invention relates to a crystal oscillation device and an electronic device, and more particularly, to a crystal oscillation device, for example, used as a reference signal source in a PLL (Phase-Locked Loop) circuit included in a RF (Radio Frequency) circuit of a portable telephone and to an electronic device including the crystal oscillation device.

2. Description of the Related Art

In a conventional crystal oscillation device used as a reference signal source, a crystal oscillator is used as a resonator, and circuit components that define an oscillation circuit, a temperature-compensating circuit, and other suitable components are combined with the crystal oscillator. The conventional crystal oscillator normally has a structure in which a crystal strip with an electrode is hermetically mounted in a package made of ceramic or other suitable material. The circuit components need to be mounted on a circuit board made of ceramic or other suitable material. By combining the crystal oscillator and the circuit board by any means, an oscillation device is constructed.

Crystal oscillation devices in which a crystal oscillator and a circuit board are combined are taught in Japanese Unexamined Patent Application Publication Nos. 2001-177345, 2002-84138, and 2002-64333.

In a crystal oscillation device disclosed in Japanese Unexamined Patent Application Publication No. 2001-177345, circuit components are mounted on wires provided at the bottom of a recess formed in a ceramic box defining a circuit board, and a crystal oscillator package having almost the same shape is placed on and combined with the ceramic box. That is, the crystal oscillator is supported by four side walls of the ceramic box.

In Japanese Unexamined Patent Application Publication No. 2002-84138, a crystal oscillator having external terminals protruding from the bottom surface to a certain height is mounted on a crystal-oscillator mounting electrode provided on a flat thin circuit board. There is a space between the circuit board and the crystal oscillator corresponding to the height of the external terminals, and a circuit component is mounted in the space. An integrated circuit is used as the circuit component in order to achieve a low profile. The space between the circuit board and the crystal oscillator is filled with underfill resin so as to cover the circuit component and the external terminals of the crystal oscillator. While external terminals are also provided on the bottom surface of the circuit board, they do not overlap the external terminals of the crystal oscillator in plan view.

In Japanese Unexamined Patent Application Publication No. 2002-64333, columnar members are mounted on a flat thin circuit board, and a crystal oscillator is disposed on the columnar members. The columnar members also electrically connect the circuit board and the crystal oscillator and may be provided integrally with or separate from a package of the crystal oscillator. The positions of the columnar members coincide with the positions of external terminals provided on the bottom surface of the circuit board in plan view.

In Japanese Unexamined Patent Application Publication No. 2001-177345, because the circuit board is formed of a ceramic box, it is difficult to reduce the cost thereof. Moreover, it is much more difficult to mount circuit components on the bottom of the recess of the box-shaped circuit board than to mount the components on a flat board, and it is also difficult to reduce the operation cost. In addition, the area of the circuit board must be increased corresponding to the thicknesses of the four side walls of the box-shaped circuit board, and this hinders size reduction of the crystal oscillation device.

In Japanese Unexamined Patent Application Publication No. 2002-84138, because the external terminals protrude from the case of the crystal oscillator, the cost of the crystal oscillator is increased.

In Japanese Unexamined Patent Application Publication No. 2002-64333, because the crystal oscillator is supported only by the columnar members, the strength is insufficient. While the strength can be increased by forming the columnar members integrally with the package of the crystal oscillator, the cost of the package is increased.

SUMMARY OF THE INVENTION

To overcome the problems described above, preferred embodiments of the present invention provide a small, low-profile, and low-cost crystal oscillation device that is rarely damaged by a drop impact or other damaging impacts and to provide an electronic device using the crystal oscillation device.

According to a first preferred embodiment of the present invention, a crystal oscillation device includes a crystal oscillator with a package having first connecting electrodes on a flat bottom surface and a flat thin circuit board having circuit components and second connecting electrodes provided corresponding to the first connecting electrodes on one principal surface. The first connecting electrodes are electrically connected to the second connecting electrodes with solder therebetween. At least one of the solder and a top surface of at least one of the circuit components act as supports for the crystal oscillator. The highest support is one of the circuit components. All of the supports may be the circuit components.

Preferably, all of the supports are substantially equal in height. For that purpose, a spacer may be attached to at least one of the supports other than the highest support. The circuit component being the support may be a molded resin component.

Preferably, the supports are positioned to support the crystal oscillator on the circuit board even in a state in which the solder for connecting the first connecting electrodes and the second connecting electrodes is not provided.

Preferably, the first connecting terminals and the second connecting terminals are disposed inside the outermost edge of the crystal oscillator and the circuit board.

The resulting crystal oscillation device according to preferred embodiments of the present invention has greatly reduced size and cost.

According to another preferred embodiment of the present invention, an electronic device includes the above-described crystal oscillation device, such that the performance of the electronic device is greatly improved.

These and other elements, features, characteristics and advantages of the present invention will become apparent from the following description of preferred embodiments thereof with reference to the attached drawings.

DETAILED DESCRIPTION OF PREFERRED EMBODIMENTS

Figure 1:
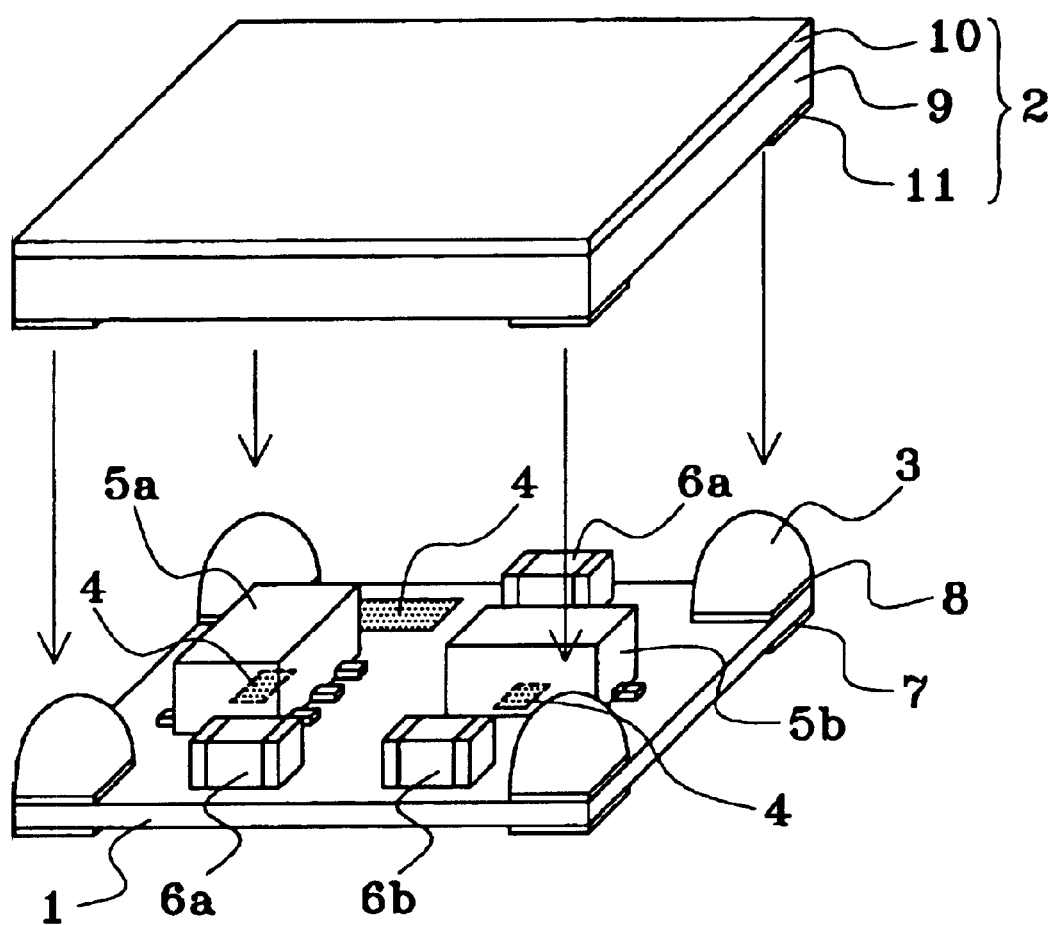
FIG. 1 is an exploded perspective view of a crystal oscillation device according to a first preferred embodiment of the present invention.
Figure 2A:
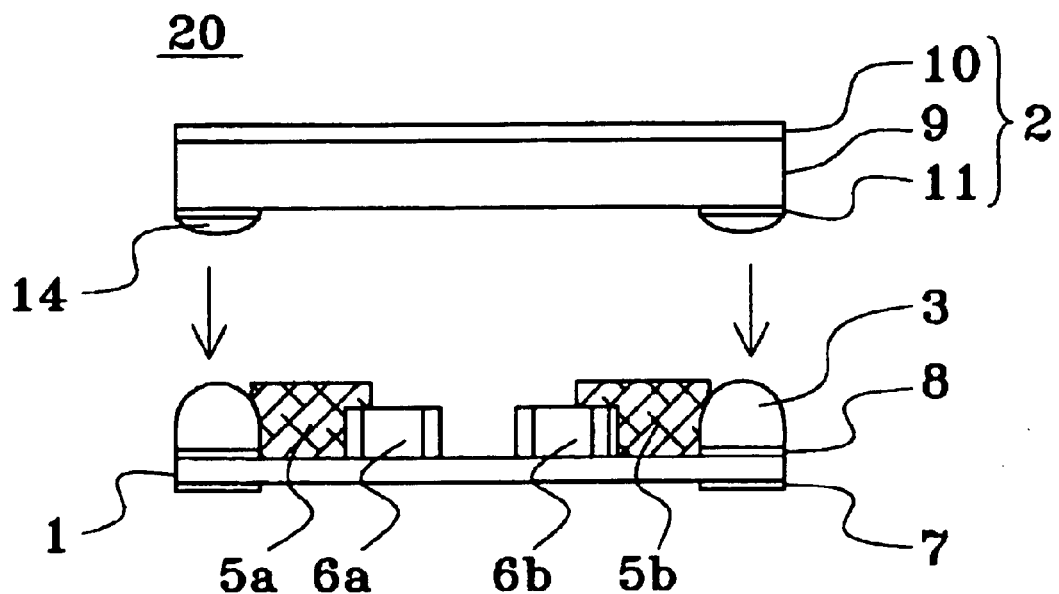
FIGS. 2A and 2B are side views of the crystal oscillation device shown in FIG. 1.
Figure 2B:
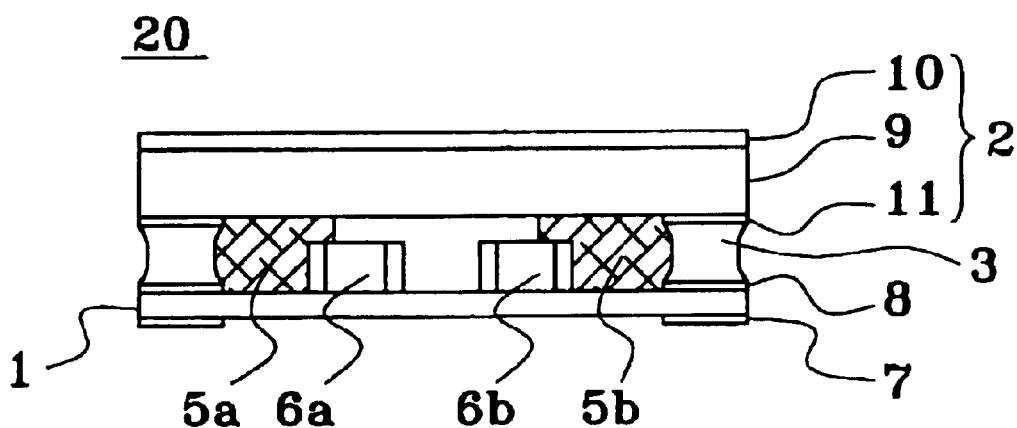
Figure 3A:
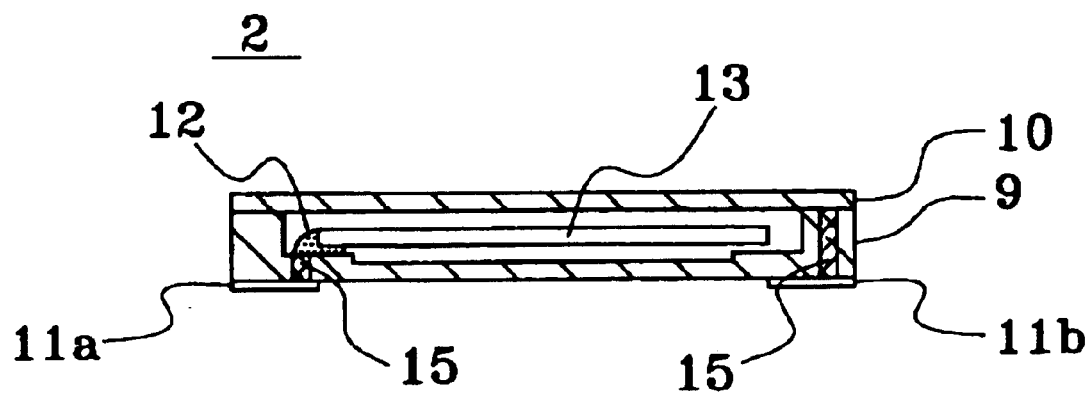
FIGS. 3A and 3B are a cross-sectional view and a bottom view, respectively, of a crystal oscillator used in the crystal oscillation device shown in FIG. 1.
Figure 3B:
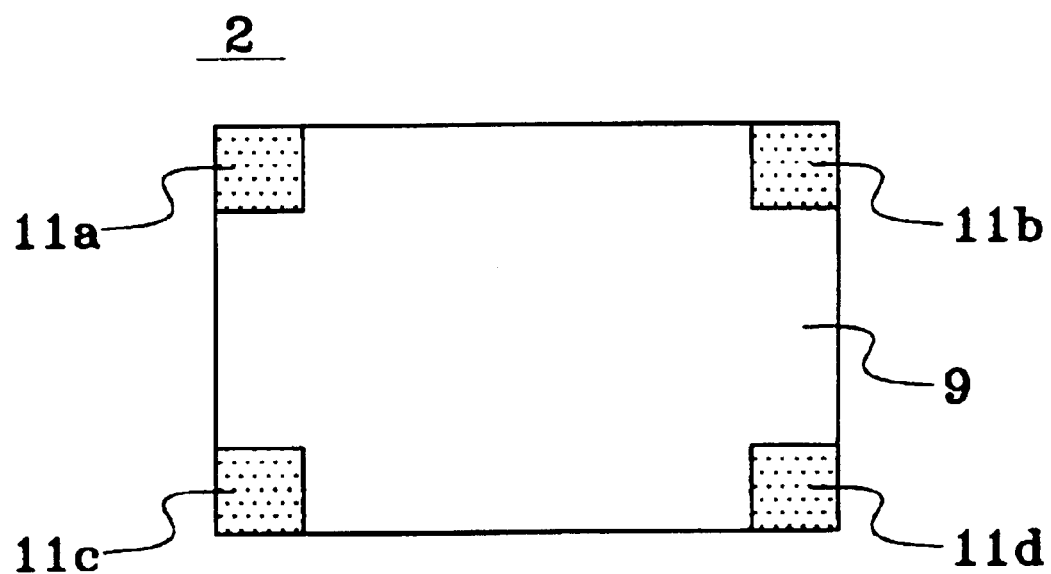

FIG. 1 is an exploded perspective view of a crystal oscillation device according to the first preferred embodiment, FIGS. 2A and 2B are side views of the crystal oscillation device, and FIGS. 3A and 3B are a cross-sectional view and a bottom view, respectively, of the crystal oscillation device. Referring to FIGS. 1, 2A, and 2B, a crystal oscillation device 20 preferably has a configuration in which a packaged oscillator 2 is mounted on a flat thin circuit board 1.

Circuit components, such as a transistor 5a, a varicap diode 5b, chip capacitors 6a, and a thermistor 6b, are mounted on the circuit board 1. The transistor 5a and the varicap diode 5b are preferably molded resin components, are substantially equal in height, and have a flat top surface. Printed resistors 4 are also preferably formed as circuit components on the circuit board 1. Some of the printed resistors 4 are provided under the transistor 5a and the varicap diode 5b. These circuit components form an oscillation circuit (excluding a resonant element) and a temperature-compensating circuit. Second connecting electrodes 8 are provided at the four corners of the circuit board 1, and external connection electrodes 7 are provided on the rear surface of the circuit board 1 so as to oppose the second connecting electrodes 8.

The crystal oscillator 2 includes a ceramic container 9 shaped like a box having an opening on its upper side, a crystal strip 13 supported at one end with conductive adhesive 12 inside the ceramic container 9, and a metal cover 10 that closes the opening of the ceramic container 9. The ceramic container 9 and the metal cover 10 define a package of the crystal oscillator 2. First connecting electrodes 11 (11a to 11d) are provided at the four corners of a flat bottom surface of the ceramic container 9. Two of the first connecting electrodes 11a and 11c are electrically connected to an electrode of the crystal strip 13 via connecting wires 15 provided inside the ceramic container 9. The other first connecting electrodes 11b and 11d define ground electrodes that are connected to a ground electrode of the circuit board 1. By the connection to the ground electrode, the metal cover 10 is grounded to function as an electric shield. The crystal strip 13 may be supported at both ends instead of being supported at one end.

In the crystal oscillation device 20, the crystal oscillator 2 is placed on the circuit board 1, and the first connecting electrodes 11 of the crystal oscillator 2 are electrically connected to the second connecting electrodes 8 of the circuit board 1 with solder 3. The amount of the solder 3 is determined such that, when the circuit board 1 and the crystal oscillator 2 are attracted to each other by the surface tension of the solder 3 in a melted state, they are prevented from approaching further after the bottom surface of the ceramic container 9 of the crystal oscillator 2 touches the top surfaces of the transistor 5a and the varicap diode 5b. Therefore, in the crystal oscillation device 20, the crystal oscillator 2 is supported by the transistor 5a and the varicap diode 5b while being attracted toward the circuit board 1 by the solder 3. Thus, the transistor 5a and the varicap diode 5b function as supports for the crystal oscillator 2.

FIG. 2A shows a state before the crystal oscillator 2 is mounted on the circuit board 1. Solder paste 14 is provided on the first connecting electrodes 11 of the crystal oscillator 2 so that the first connecting electrodes 11 can be easily joined to the solder 3.

In the crystal oscillation device 20 of the first preferred embodiment of the present invention, adhesive or resin for bonding the bottom surface of the ceramic container 9 and the top surfaces of the transistor 5a and the varicap diode 5b is not provided therebetween. In an unmelted state, the solder 3 serves to electrically connect the circuit board 1 and the crystal oscillator 2 and to attract the crystal oscillator 2 toward the circuit board 1. In a melted state, the solder 3 serves to attract the circuit board 1 and the crystal oscillator 2 by its surface tension and to thereby prevent the circuit board 1 and the crystal oscillator 2 from being separated and displaced. The solder 3 does not have a function of supporting the crystal oscillator 2 at a predetermined height. Therefore, for example, when the amount of the solder 3 exceeds a predetermined value, the distance between the circuit board 1 and the crystal oscillator 2 is larger than the height of the transistor 5a and the varicap diode 5b, and the crystal oscillator 2 is supported at a given height only by the solder 3. The present invention does not cover such a case.

In order to support the crystal oscillator 2 by the circuit components, adequate care is necessary to arrange and mount the circuit components which define supports on the circuit board 1. More specifically, the circuit components (the transistor 5a and the varicap diode 5b) must be arranged so that the crystal oscillator 2 will not fall off the circuit components even in a state in which the first connecting electrodes 11 of the crystal oscillator 2 and the second connecting electrodes 8 of the circuit board 1 are not connected by the solder 3.

Because the crystal oscillation device 20 having such a configuration uses the flat thin circuit board 1, the cost can be made lower than in a case in which a box-shaped circuit board is used as disclosed in the above-described patent publication, Japanese Unexamined Patent Application Publication No. 2001-177345. Moreover, the flat circuit board allows the electrodes and resistors to be easily printed thereon, and allows the circuit components to be mounted thereon without any special means. This reduces the manufacturing cost. Furthermore, because side walls are not provided, unlike the box-shaped circuit board, the area in which the circuits are provided is increased. As a result, the size of the circuit board, and the size of the crystal oscillation device is reduced.

Because the crystal oscillator 2 can use a popular surface-mounted package (ceramic container) without providing protruding external terminals, which are disclosed in the above-described patent publication, Japanese Unexamined Patent Application Publication No. 2002-84138, an unnecessary increase in cost is prevented.

Because the crystal oscillator 2 is supported by the top surfaces of the circuit components and is attracted toward the circuit board 1 by the solder 3, distortion such as deflection is reduced by the elastic force of the solder 3 compared with the structure in which the crystal oscillator is supported only by the columnar members, as in the above-described patent publication, Japanese Unexamined Patent Application Publication No. 2002-64333. Therefore, the mechanical strength of the entire crystal oscillation device 20 is increased.

When the columnar members are different in height, mechanical connection failure may occur. In contrast, the solder deforms into an optimal shape by its surface tension in a melted state and mechanical connection failure rarely occurs. Even if mechanical connection is established by the columnar members, electrical connection may not be established, depending on the material of the columnar members or the positions of electrodes formed in the columnar members. When a mechanical connection is established by the solder, an electrical connection is also established, and electric connection failure rarely occurs. Furthermore, because the height of the space between the circuit board 1 and the crystal oscillator 2 does not exceed the height of the highest circuit component, the crystal oscillation device 20 has a low profile.

In terms of circuit wiring, the circuit board and the crystal oscillator may be electrically connected at at least two points (at the first connecting electrodes 11a and 11c in the crystal oscillator 2). However, the circuit board 1 and the crystal oscillator 2 in the first preferred embodiment of the present invention are connected at four points because, in the case in which the connection is made at two points, even if the crystal oscillator is supported by the circuit components, the mechanical strength of the crystal oscillation device is insufficient and the position of the crystal oscillator is not fixed when the crystal oscillator is mounted on the circuit board. Accordingly, it is preferable that the circuit board and the crystal oscillator be connected with solder at at least three points.

Another reason lies in that the metal cover of the crystal oscillator is grounded to function as an electric shield. In crystal oscillation devices, particularly in a temperature-compensated crystal oscillation device, the frequency with respect to external electromagnetic noise is required to be stable. In order to use the metal cover of the crystal oscillator as a shield, the circuit board and the crystal oscillator also need to be connected with solder at at least three points.

Preferably, the first connecting electrodes of the crystal oscillator and the second connecting electrodes of the circuit board are provided at at least four corners of the substantially rectangular bottom surface of the crystal oscillator, as shown in FIGS. 3A and 3B. When only three first connecting electrodes are used, for example, two electrodes are disposed at the two adjoining corners, and the other electrode is disposed between the two remaining corners. It is not particularly limited which first connecting electrode is connected to the crystal strip or functions as a ground electrode.

Figure 4:
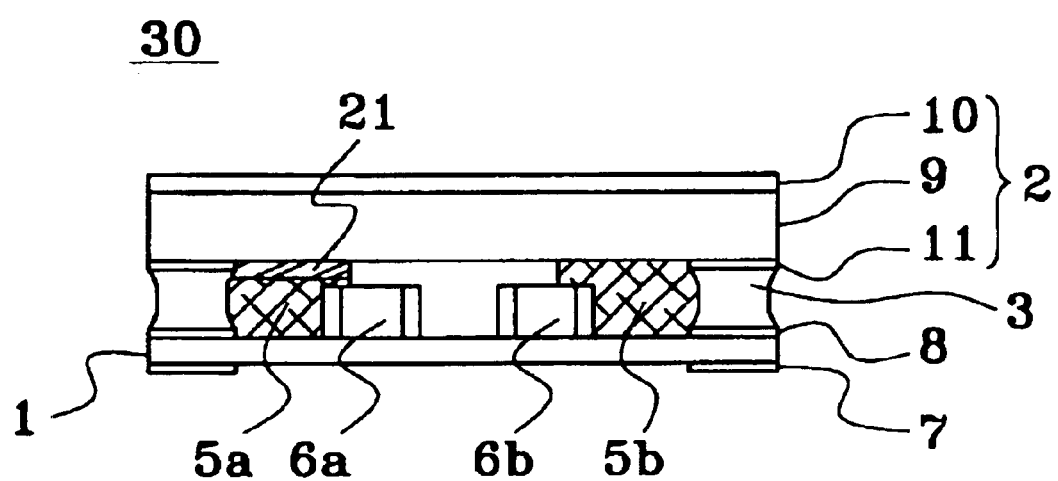
FIG. 4 is a side view of a crystal oscillation device according to a second preferred embodiment of the present invention.

FIG. 4 is a side view of a crystal oscillation device according to a second preferred embodiment of the present invention. In FIG. 4, the components that are identical or equivalent to those in FIGS. 1 to 3 are denoted by the same reference numerals, and descriptions thereof are omitted.

In a crystal oscillation device 30 shown in FIG. 4, a transistor 5a is lower than a varicap diode 5b, and a spacer 21 is bonded to a top surface of the transistor 5a in order to make up for the shortage of the height. The transistor 5a and the varicap diode 5b are thereby made substantially equal in height and can function as supports for a crystal oscillator 2 in a manner similar to that in the crystal oscillator 20 of the first preferred embodiment of the present invention.

In the case in which the heights of the circuit components used as supports are outside an allowable range, a spacer may be bonded to one or some supports except the highest one. While the support and the spacer are bonded with adhesive or other suitable material, the spacer and the crystal oscillator are only in contact with each other and are not bonded with adhesive or resin. Although the number of components and processes slightly increases, just the same operational advantages as those of the crystal oscillator 20 of the first preferred embodiment of the present invention can be provided.

In the above-described two preferred embodiments of the present invention, some of the circuit components are used as supports. In the case in which only one circuit component can be used as a support and cannot support the crystal oscillator by itself, another support that does not function as a circuit component may be provided. That is, a component that functions only as a support may be used. In this case, the height of the component functioning only as a support is not higher than the highest circuit component.

In the crystal oscillation devices of the above-described two preferred embodiments of the present invention, the first connecting electrodes 11 are preferably provided at the four corners of the bottom surface of the ceramic container 9 such that they are in contact with the edges of the ceramic container 9. The second connecting electrodes 9 are also preferably provided at the four corners of the top surface of the circuit board 1 such that they are in contact with the edges of the circuit board 1. The solder 3 disposed between the first and second connecting electrodes 11 and 8 is preferably shaped like a hourglass that is thinner at the center in the height direction than at both ends. This shape is formed by the surface tension of the solder 3 in a melted state. For this reason, the solder 3 does not protrude outward from the outer edges of the crystal oscillator 2 and the circuit board 1 in plan view.

The shape of the solder 3 changes depending on the areas of the first and second connecting electrodes 11 and 8 and the amount of the solder 3. For example, when the amount of the solder 3 slightly increases, the solder 3 maintains its property of attracting the crystal oscillator 2 and the circuit board 1 by it surface tension in a melted state and may be shaped like a barrel that is thicker at the center in the height direction than at both ends. In such a case, the solder 3 may protrude outward from the outer edges of the crystal oscillator 2 and the circuit board 1 in plan view. When the solder 3 protrudes therefrom, it may touch a component mounted on a printed circuit board on which the crystal oscillation device is also mounted and may cause a short circuit. In order to prevent such trouble, the crystal oscillation device must be placed in a sufficient space. This substantially increases the mounting area of the crystal oscillation device.

Figure 5:
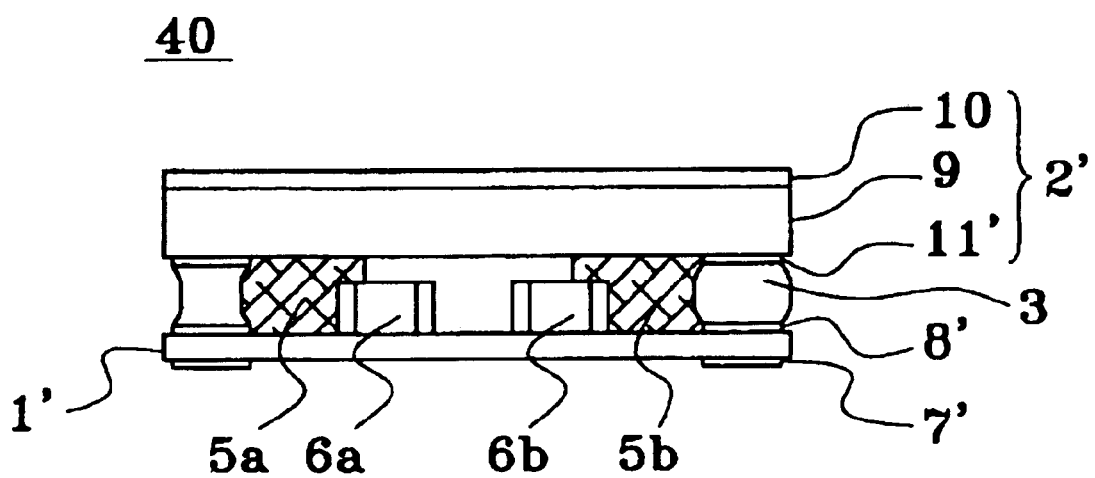
FIG. 5 is a side view of a crystal oscillation device according to a third preferred embodiment of the present invention.

FIG. 5 is a side view of a crystal oscillation device according to a third preferred embodiment of the present invention that remedies the above-described problem. In FIG. 5, the components that are identical or equivalent to those in FIGS. 1 to 3 are denoted by the same reference numerals, and descriptions thereof are omitted.

In a crystal oscillation device 40 shown in FIG. 5, first connecting electrodes 11' of a crystal oscillator 2' are disposed inside the outermost edges of a bottom surface of a ceramic container 9. Second connecting terminals 8' and external connection electrodes 7' of a circuit board 1' are also disposed inside the outermost edges of the circuit board 1'.

In the crystal oscillation device 40 having such a configuration, even when solder 3 for connecting the circuit board 1' and the crystal oscillator 2' is thick at the center in the height direction, as shown on the right side of FIG. 5, it does not protrude outward from the outer edges of the crystal oscillator 2' and the circuit board 1'. For this reason, when the crystal oscillation device 40 is mounted on a printed circuit board or other suitable mounting device, the distances between the crystal oscillation device 40 and other components can be reduced, and the mounting area can be reduced.

In most crystal oscillation devices having the configurations described in the above preferred embodiments of the present invention, before a motherboard composed of a plurality of circuit boards connected in rows and columns is divided, circuit components and a crystal oscillator are mounted on each circuit board. Discrete crystal oscillation devices are finally produced by dividing the motherboard.

However, in the crystal oscillation devices of the above preferred embodiments of the present invention, the outline of the crystal oscillator and the outline of the circuit board coincide with each other in plan view. Therefore, when crystal oscillators are mounted on the motherboard, there is no space between the adjoining crystal oscillators. In such a case, in order to divide the motherboard into circuit boards by dicing, a cutter of a dicing machine must be put on the back side of the motherboard. If the top surfaces of a plurality of crystal oscillators are inclined with respect to the circuit boards or if the heights of the crystal oscillators from the circuit boards are different, the motherboard may tilt and dicing may be difficult.

Figure 6A:
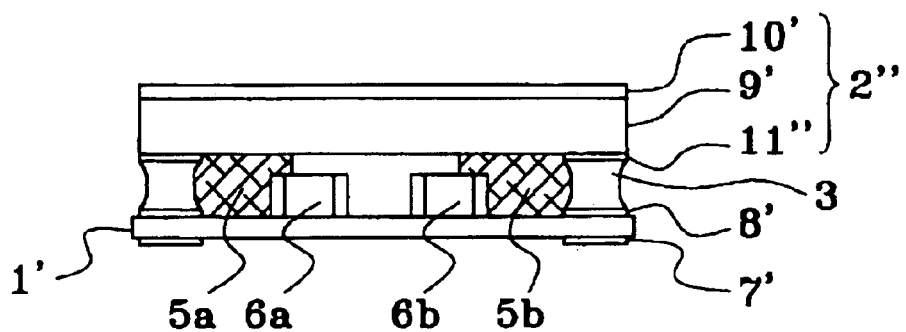
FIG. 6A is a side view of a crystal oscillation device according to a fourth preferred embodiment of the present invention.
Figure 6B:
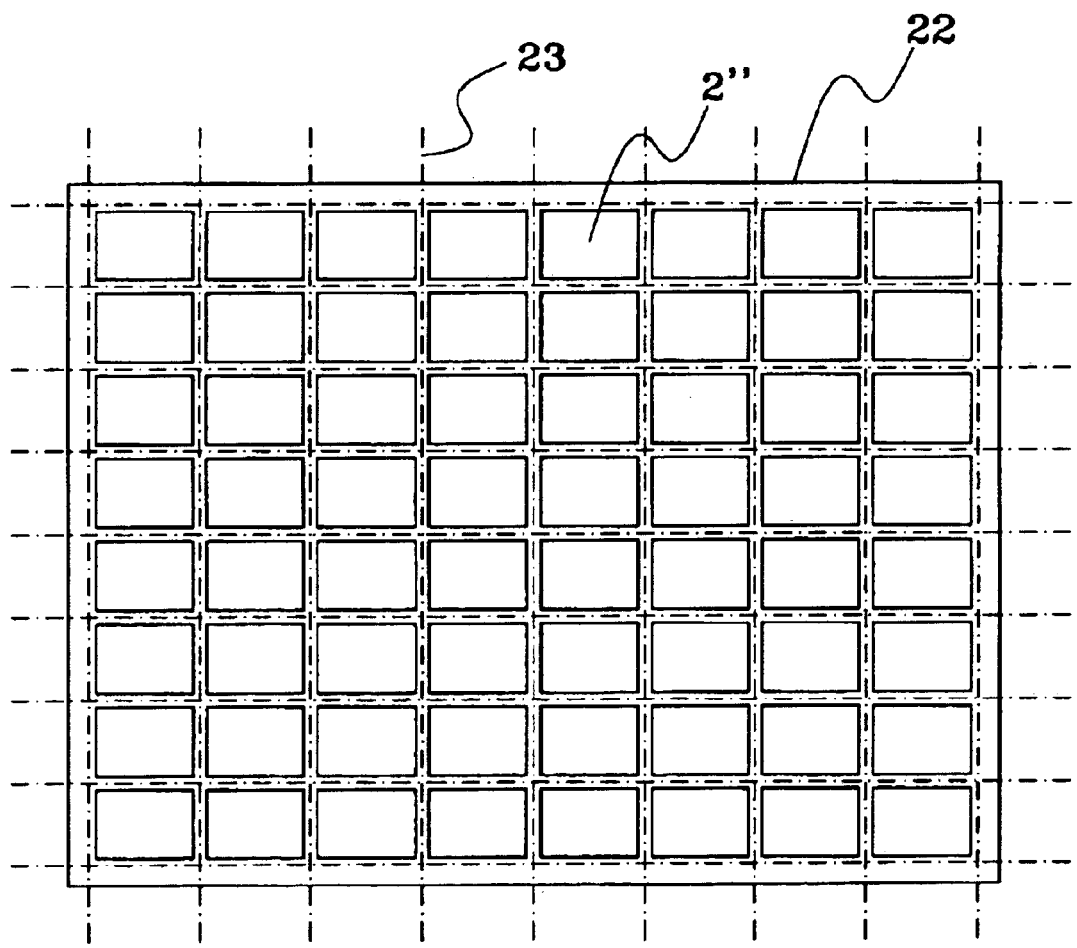
FIG. 6B is a plan view of a motherboard before being divided into crystal oscillation devices.

FIG. 6A is a side view of a crystal oscillation device according to a fourth preferred embodiment of the present invention that remedies the above problem, and FIG. 6B is a plan view of a motherboard before dicing. In FIGS. 6A and 6B, the components that are identical or equivalent to those in FIG. 5 are denoted by the same reference numerals, and descriptions thereof are omitted.

In a crystal oscillation device 50 shown in FIG. 6A, a ceramic container 9' and a metal cover 10' are shaped so that the outline of a crystal oscillator 2" is slightly smaller than the outline of a circuit board 1' in plan view. First connecting terminals 11" are provided on a bottom surface of the ceramic container 9'. In the circuit board 1', second connecting terminals 8' and external connection electrodes 7' are disposed inside the outermost edges of the circuit board 1' in a manner similar to that in the crystal oscillator 40 such that the first connecting terminals 11" and the second connecting terminals 8' oppose each other.

In the crystal oscillation device 50 having such a configuration, because the outline of the crystal oscillator 2" is smaller than the outline of the circuit board 1', even when crystal oscillators 2" are mounted on a motherboard 22, as shown in FIG. 6B, there is a space between the adjoining crystal oscillators 2", and dicing lines 23 can be viewed from the side of a component mounting surface of the motherboard 22. Since a cutter of a dicing machine can be put on the motherboard 22 from the component mounting surface, dicing will not be made difficult by the mounted components such as crystal oscillators.

While a molded resin transistor and a varicap diode are used as circuit components which define supports in the above-described preferred embodiments, an integrated circuit including discrete elements may be used as a support, regardless of whether the elements are molded resin components.

Figure 7:
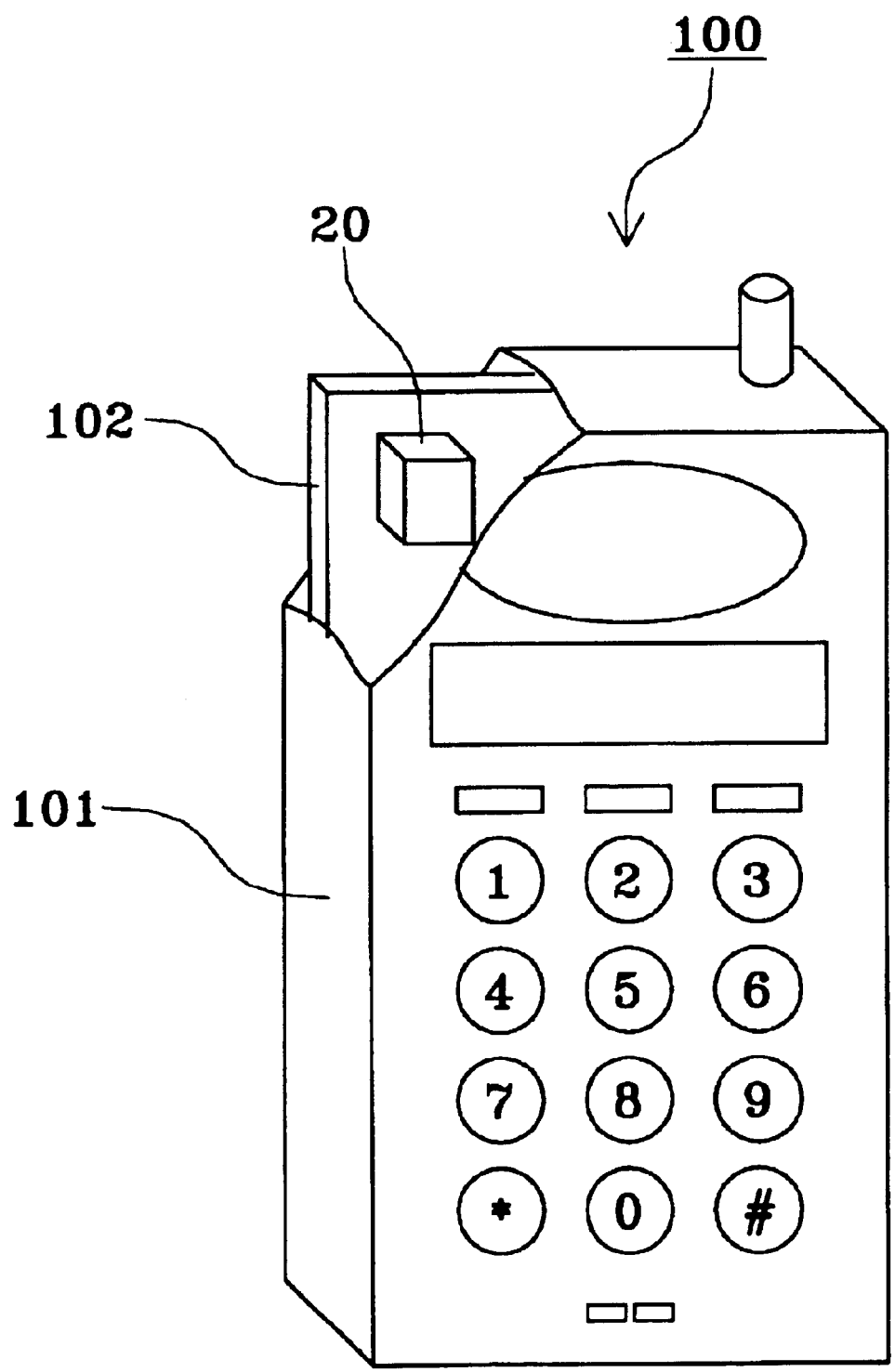
FIG. 7 is a perspective view of an electronic device including a crystal oscillation device of the preferred embodiments of the present invention.

FIG. 7 is a perspective view showing an example of an electronic device using a crystal oscillation device according to preferred embodiments of present invention. Referring to FIG. 7, a portable telephone 100 as an example of an electronic device includes a housing 101, a printed circuit board 102 disposed inside the housing 101, and a crystal oscillation device 20 of the present invention that is mounted as a reference signal source on the printed circuit board 102.

Because the portable telephone 100 having such a configuration uses the crystal oscillation device 20 of preferred embodiments of the present invention, the size and cost is reduced.

While the portable telephone is shown as an electronic device in FIG. 7, the electronic device is not limited to the portable telephone. Any electronic device may be applicable as long as it uses the crystal oscillation device of preferred embodiments of the present invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A crystal oscillation device comprising:
   a crystal oscillator with a package having first connecting electrodes on a flat bottom surface; and
   a flat thin circuit board having circuit components and second connecting electrodes corresponding to the first connecting electrodes on one principal surface; wherein
   the first connecting electrodes are electrically connected to the second connecting electrodes with solder therebetween;
   at least one of the solder and a top surface of at least one of the circuit components define supports for the crystal oscillator; and
   the highest of the supports is one of the circuit components.

2. A crystal oscillation device according to claim 1, wherein all of the supports for the crystal oscillator are defined by the circuit components.

3. A crystal oscillation device according to claim 1, wherein all of the supports are substantially equal in height.

4. A crystal oscillation device according to claim 1, wherein a spacer is attached to at least one of the supports other than a highest of the supports.

5. A crystal oscillation device according to claim 1, wherein the circuit components include a molded resin component.

6. A crystal oscillation device according to claim 1, wherein the supports are positioned to support the crystal oscillator on the circuit board even in a state in which the solder for connecting the first connecting electrodes and the second connecting electrodes is not provided.

7. A crystal oscillation device according to claim 1, wherein the first connecting terminals and the second connecting terminals are disposed inside an outermost edge of the crystal oscillator and the circuit board.

8. An electronic device comprising a crystal oscillation device according to claim 1.

9. A crystal oscillation device according to claim 2, wherein all of the supports are substantially equal in height.

10. A crystal oscillation device according to claim 2, wherein the circuit component defining one of the supports is a molded resin component.

11. A crystal oscillation device according to claim 3, wherein the circuit component defining one of the supports is a molded resin component.

12. A crystal oscillation device according to claim 4, wherein the circuit component defining one of the supports is a molded resin component.

13. A crystal oscillation device according to claim 1, wherein the solder is hour-glass shaped.

14. A crystal oscillation device according to claim 2, wherein the supports are positioned to support the crystal oscillator on the circuit board even in a state in which the solder for connecting the first connecting electrodes and the second connecting electrodes is not provided.

15. A crystal oscillation device according to claim 3, wherein the supports are positioned to support the crystal oscillator on the circuit board even in a state in which the solder for connecting the first connecting electrodes and the second connecting electrodes is not provided.

16. A crystal oscillation device according to claim 4, wherein the supports are positioned to support the crystal oscillator on the circuit board even in a state in which the solder for connecting the first connecting electrodes and the second connecting electrodes is not provided.

17. A crystal oscillation device according to claim 1, wherein the circuit components include at least one of a transistor and a varicap diode.

18. A crystal oscillation device according to claim 2, wherein the first connecting terminals and the second connecting terminals are disposed inside an outermost edge of the crystal oscillator and the circuit board.

19. A crystal oscillation device according to claim 1, wherein an outer edge of the crystal oscillator is within an outer edge of the circuit board in a plan view.

20. A crystal oscillation device according to claim 1, wherein the solder does not protrude outward from the outer edges of the crystal oscillator and the outer edges of the thin flat circuit board.

* * * * *